United States Patent [19]

Del Giudice

[11] 4,392,255
[45] Jul. 5, 1983

[54] COMPACT SUBHARMONIC MIXER FOR EHF WAVE RECEIVER USING A SINGLE WAVE GUIDE AND RECEIVER UTILIZING SUCH A MIXER

[75] Inventor: Michel Del Giudice, Paris, France

[73] Assignee: Thomson-CSF, Paris, France

[21] Appl. No.: 223,474

[22] Filed: Jan. 8, 1981

[30] Foreign Application Priority Data

Jan. 11, 1980 [FR] France ............................... 80 00613

[51] Int. Cl.³ .............................................. H04B 1/26
[52] U.S. Cl. ..................................... 455/328; 455/330
[58] Field of Search .............................. 455/325–328, 455/330, 333

[56] References Cited

U.S. PATENT DOCUMENTS 2,754,416  7/1956  Hope ................................... 455/328
3,980,974  9/1976  Yamamoto et al. ................... 333/33
4,306,312  12/1981  Cachier .............................. 455/328

FOREIGN PATENT DOCUMENTS 2215525  3/1972  Fed. Rep. of Germany.
2010036  of 0000  United Kingdom.

Primary Examiner—Jin F. Ng
Attorney, Agent, or Firm—Oblon, Fisher, Spivak, McClelland & Maier

[57] ABSTRACT

A subharmonic mixer, whose local oscillator is at half the frequency of that of the signal to be received, comprising a detector and a local oscillator positioned in a single waveguide (301). The mixer comprises a first module (51) serving as the local oscillator and incorporating an oscillation diode surrounded by dielectric material and connected to a wide metal coating, as well as a second module (52) incorporating an antiparallel connection of two Schottky diodes and which is identical to the first module. The metal coatings of these two modules are in contact with metallized areas (53, 54) of a double-faced printed circuit (15) serving for the polarization of one module and for the signal output of the other.

6 Claims, 5 Drawing Figures

COMPACT SUBHARMONIC MIXER FOR EHF WAVE RECEIVER USING A SINGLE WAVE GUIDE AND RECEIVER UTILIZING SUCH A MIXER

BACKGROUND OF THE INVENTION

The present invention relates to a subharmonic mixer, i.e. a mixer operating with a local oscillator, whose frequency is half the frequency of a radio reception signal, with a view to carrying out the necessary frequency change prior to the amplification and detection of the signal to be processed in an EHF wave receiver.

It is known that it is possible to carry out the frequency change in an EHF wave receiver by using a symmetrical mixer which is placed in a waveguide carrying the signal to be received. An advantageous solution from the industrial standpoint is described in the U.S. Pat. No. 4,306,312, by the Applicant Company and in the Japanese Application No. 036035/80 filed on the same date. It involves the head to tail arrangement of two modules, each of which contains a detecting diode in the waveguide in which there is the electromagnetic field of the signal to be processed. The mixer is coupled to a waveguide at which discharges the local oscillator on the one hand and on the other hand to an amplifier of the beat frequency. The receiver having this amplifier has the advantage of being very sensitive to the signal to be received and relatively insensitive to the amplitude variations of the local oscillator. However, it has the disadvantages of requiring two waveguides, one for the signal to be processed and the other for the local signal making it necessary to use complex coupling means and of requiring a local oscillator at the same frequency as the signal to be received, which consequently becomes more onerous and less powerful as the frequency increases.

BRIEF SUMMARY OF THE INVENTION

The invention makes it possible to retain the advantages of the first solution, whilst obviating the disadvantages, even at very high frequencies. Thus, only a single waveguide is necessary and the subharmonic mixer used is relatively insensitive to amplitude variations of the local oscillator.

The present invention therefore relates to a subharmonic mixer for an extremely high frequency wave receiver incorporating a waveguide carrying the signal to be received, wherein in the same waveguide it has a local oscillator and a detector means with two semiconductor diodes in antiparallel connection, a capacitive coupling existing between the mixer means and the oscillator, and connecting means with the outside of the guide ensuring the output of the mixer and the supply for the local oscillator and the mixer means.

BRIEF DESCRIPTION OF THE DRAWINGS

The invention is described in greater detail hereinafter relative to non-limitative embodiments and the attached drawings, wherein there is shown.

DETAILED DESCRIPTION OF THE PREFERRED EMBODIMENTS

Figure 1:
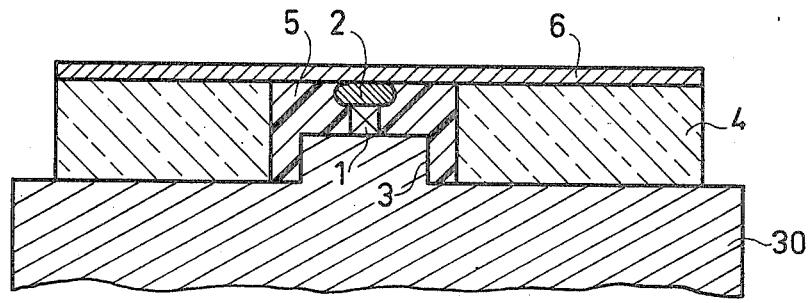
FIG. 1 an embodiment of the local oscillator.

FIG. 1 shows a local oscillator in the form of a module in accordance with the aforementioned application. The module incorporates a Gunn or avalanche-type semiconductor diode able to oscillate in EHF waves. This diode 1 is mounted on a platform 3 projecting over a metal support 30.

Diode 1 is surmounted by a gold disk 2, whose dimensions are larger than those of the diode. Platform 3 is surrounded by a ring 4 made from glass of the "quartz" type (molten silica) with a square or rectangular cross-section. The gap left free between the central part of the source and the glass ring is filled with a resin 5 having a dielectric coefficient close to that of the glass constituting the ring and which is also able to resist temperatures of approximately 300° to 500° C. An example of this material is polyimide resin. A metal coating 6 covers the upper part and particularly disk 2. This metal coating constitutes the polarization diode of the source and support 30 constitutes the earth.

In such a source, the oscillation frequency is dependent on the dimensions (diameter and height) of the glass ring and the diameter of the metal coating.

Thus, it is possible to pretune the source by selecting not only the diameter, but also the height, whilst retaining the same support 30 and the same diode 1, providing that the thickness of connector 2 is varied.

Figure 2:
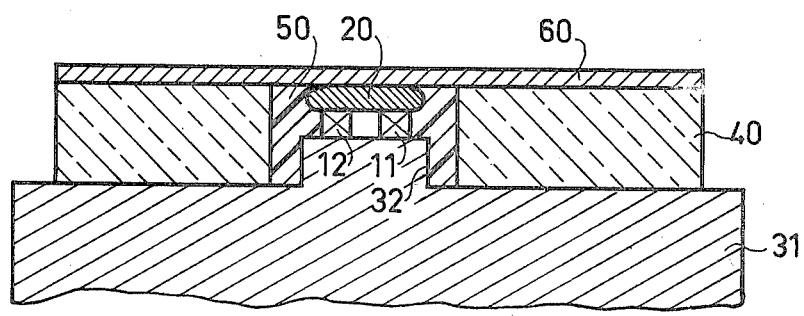
FIG. 2 an embodiment of the detector means according to the invention.

FIG. 2 shows a detecting member in the form of a module relatively similar to that of the local oscillator, but containing two semiconductor diodes 11 and 12, e.g. of the Schottky type, instead of the single Gunn or avalanche-type diode. These diodes are juxtaposed in antiparallel connection on a platform 32 projecting over a metal support 31 on the one hand and a disk 20 on the other forming the connection with a metal coating 60 preadapting the detector module to the frequency of the signal. One of the diodes is bonded to the platform on the side of the "metal-semiconductor" junction (not shown in FIG. 2) in the case of a Schottky diode, whilst the other diode is bonded to the disk on the junction side.

Figure 3:
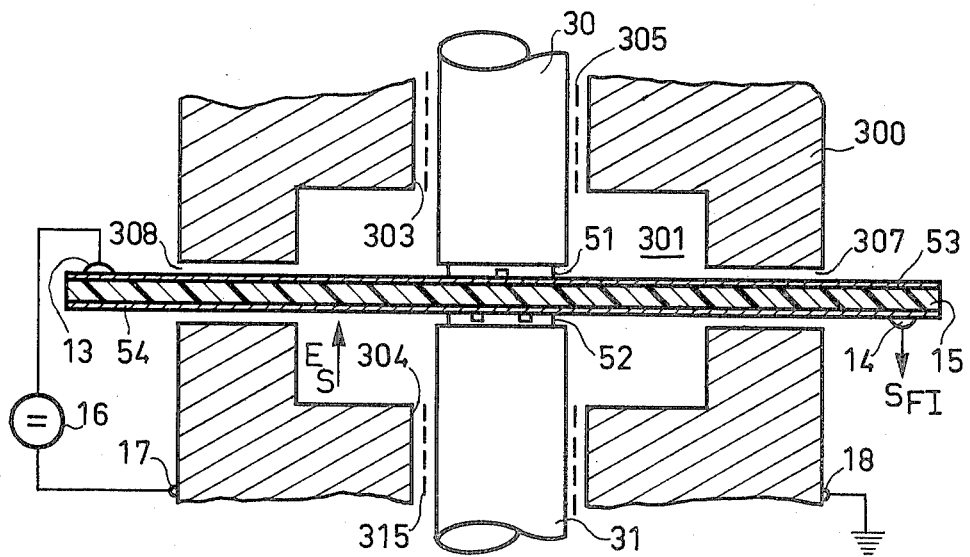
FIG. 3 diagrammatically, a subharmonic mixer according to the invention.

FIG. 3 shows in cross-section a waveguide 300 having a rectangular section 301 in which is transmitted the signal to be processed in the mixer. The electrical component $E_S$ of the electromagnetic field of the signal is parallel to the small side of rectangle 301.

Tapped openings 303, 304 are provided in the opposite walls which are parallel to the large sides of rectangle 301. The supports 30, 31 of the modules and on which are provided threads 305, 315 match with the tapped openings 303, 304.

The local oscillator module 51 and the detector module 52 are carried by their respective supports 30 and 31. These supports are pressure-screwed to maintain the metal coatings of these modules in contact with the metal coatings 53, 54 on the faces of an elongated printed circuit 15 which emerges from the guide laterally via slots 307, 308.

Module 51 is supplied by a d.c. voltage source 16 connected between two studs 13, 17 on metal coating 53 and guide 300.

Module 52 is not normally polarized, as it is supplied by induction of the field of the signal to be received and that of the local signal across the dielectric of the printed circuit 15. The output signals $S_{FI}$ are sampled between a stud 14 on metal coating 54 of printed circuit 15 and an earth connected to guide 300 by stud 18.

In certain cases, module 52 may be polarized to obtain an effective detection. In this case, the means used are identical to those making it possible to supply module 51 with direct current. A decoupler by inductance and capacitance (not shown) is then fitted in conventional manner so as to extract the intermediate frequency signal $S_{FI}$.

Figure 4:
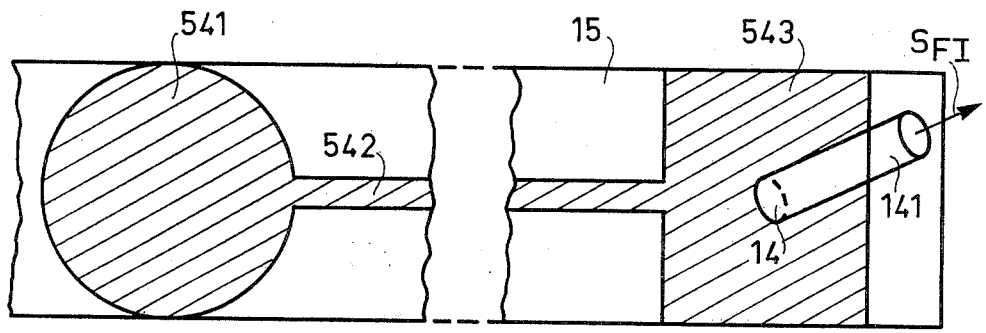
FIGS. 4 and 5 constructional details of connecting means according to the invention.

FIG. 4 represents the printed circuit 15 by a plan view showing the metal coating 54. This metal coating consists of a first part 541 having a circular shape which is to come into contact with the metal coating of module 52, followed by a second part constituted by a strip 542 of limited width and terminated by a third rectangular part 543 to which is welded stud 14 and a lead wire 141 of signal $S_{FI}$.

The not shown receiver using the mixer also forms part of the invention. It more particularly comprises a receiving antenna for the hertzian signal, the waveguide of the same signal (shown in sectional form in FIG. 3), an intermediate frequency filter, an intermediate frequency amplifier and conventional components for the amplification and detection of the low frequency signal.

The receiver operates as follows. The local oscillator module transmits electromagnetic energy. Although it is not propagated in the guide, this wave pumps the diodes of the subharmonic detector module in such a way that in the diodes there is a beat between the local signal and the signal to be received present in the waveguide. As a result, an intermediate signal is produced which is collected and transmitted by the metal coating of the detector module.

In creating the intermediate frequency, the fluctuations associated with the local oscillator are substantially eliminated.

In a variant of the subharmonic mixer of FIGS. 1 and 2 according to the invention, an apparatus is used in the case where it is applied to module 52 for creating the polarization of the local oscillator module and for collecting the intermediate frequency signal from the mixer module.

Figure 5:
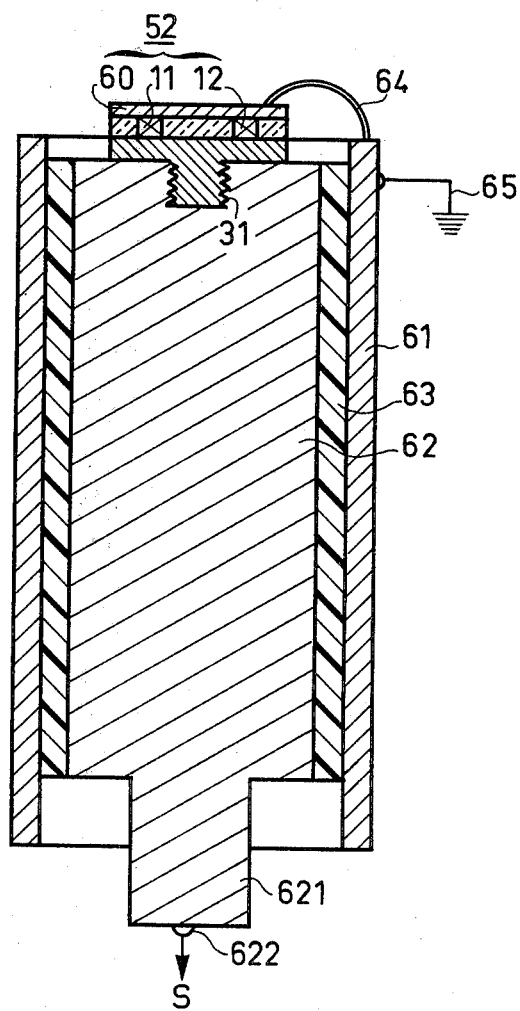

The apparatus of FIG. 5 is a subassembly to be introduced into the opening 304 of guide 301. It has a metal sleeve 61, e.g. of copper. Into the sleeve is inserted a metallic copper member 62 coated with an insulating layer 63. Member 62 has a tapped hole into which is screwed support 31 of module 52 having diodes 11 and 12 and their electrode 60. The latter electrode is connected by a connection 64 to sleeve 61 and to an earth 65 which is that of guide 300. Member 62 also has an end 621 provided with a stud 622 for extracting the intermediate frequency signal $S_{FI}$.

An identical apparatus is used for the local oscillator module, a continuous supply source then being inserted between the stud of member 63 and the earth of the guide. In this variant, it is no longer necessary to use printed circuit 15 and there is no need for providing lateral openings in guide 300.

It should be noted that connection 64 does not constitute a prejudicial earth leakage of the high frequency voltage. This is due to its high impedance as a result of the fineness of the wire used for forming connection 64 (length approx. 1 mm, diameter approx. 1/100 mm).

What is claimed is:

1. A subharmonic mixer for an extremely high frequency wave receiver for receiving high frequency waves including a wideguide carrying the signal to be received, wherein said waveguide further comprises:

a local oscillator means for producing a signal at one half the frequency of said received high frequency waves wherein said local oscillator includes a first module having a conductive support, a semiconductor diode with a negative resistance, wherein one electrode of said diode is in contact with the support of said first module and wherein the other electrode is in electrical contact with a metal coating with said metal coating extending over a dielectric material placed on the support and surrounding said diode;

a detector means including a second module having a second conductive support, two semiconductor diodes mounted in antiparallel connection, with each of said diodes having an electrode in electrical contact with said second support and the other electrode of each of said diodes is in electrical contact with a second metal coating with said second metal coating extending over a second dielectric placed on said second support and surrounding said two diodes;

first connecting means in mechanical and electrical contact with said first metal coating for connecting said local oscillator module to a D.C. supply means; and second connecting means in mechanical and electrical contact with said second metal coating for connecting said detector means to processing circuits of said receiver.

2. A mixer according to claim 1, wherein the supports of the modules traverse the waveguide on two opposite faces thereof and the connecting means traverse the guide at other points.

3. A mixer according to claim 1, wherein the semiconductor diodes of the second module are of the Schottky type, the diode of the first module being of the Gunn or avalanche type.

4. A mixer according to claim 1, wherein the metal coatings of the modules are in mechanical and electrical contact with the two metallized faces of a printed circuit, the latter forming part of said connection means with the exterior.

5. A mixer according to claim 1, wherein each module is included in an apparatus comprising a sleeve connected to the earth of the receiver, surrounding a central metal member on which is mounted the module support, the member being insulated from the sleeve and having an end opposite to the module, being provided with a connection to the connecting means.

6. A mixer according to claim 5, wherein the supports of the modules traverse the waveguide on two opposite faces thereof and the connecting means use the central member of the apparatus containing each module.

* * * * *